United States Patent [19]
Endo et al.

[11] Patent Number: 5,693,942
[45] Date of Patent: Dec. 2, 1997

[54] INFRARED DETECTOR

[75] Inventors: Haruyuki Endo; Takeshi Fuse; Hiroyuki Ishida, all of Tokyo, Japan

[73] Assignee: Ishizuka Electronics Corporation, Tokyo, Japan

[21] Appl. No.: 626,105

[22] Filed: Apr. 3, 1996

[30] Foreign Application Priority Data

Apr. 7, 1995 [JP] Japan .................. 7-082328

[51] Int. Cl.⁶ .................. G01J 5/08; G01J 5/20
[52] U.S. Cl. .................. 250/338.1
[58] Field of Search .................. 250/338.1, 338.3

[56] References Cited

U.S. PATENT DOCUMENTS 5,286,976  2/1994  Cole .................. 250/338.1
5,367,167  11/1994  Keenan .................. 250/338.1

FOREIGN PATENT DOCUMENTS 5932828   2/1994  Japan .................. 250/338.3
6-137935  5/1994  Japan .
6129898   5/1994  Japan .................. 250/338.1
6229821   8/1994  Japan .................. 250/338.4

*Primary Examiner*—Carolyn E. Fields
*Attorney, Agent, or Firm*—Lowe, Price, LeBlanc & Becker

[57] ABSTRACT

An infrared detector has a sensor with an infrared detecting portion composed of a thermal sensitive resistor film on an insulating film provided on a surface of a semiconductor substrate. The sensor is installed on a base such that it bridges a cavity in the substrate. The cavity is sealed by an infrared reflecting film or an infrared reflecting metallic board.

2 Claims, 4 Drawing Sheets 5,693,942

INFRARED DETECTOR

BACKGROUND OF THE INVENTION

1. Field of the Invention

This invention relates to an infrared detector which is a noncontacting temperature sensor for detecting infrared radiation by using a change in resistance of a thermal sensitive element caused by a change of temperature.

2. Description of the Prior Art

Previously, a thermal type infrared detector is known as one example of infrared detectors for detecting a surface temperature of an object with noncontacting detection.

The thermal type infrared detector is a sensor for measuring a surface temperature of the object under high temperature and the moving object with noncontacting condition. The temperature of the thermal sensitive element is raised by the energy of incident infrared rays radiated from the object to be detected. The surface temperature of the object to be detected is measured by capturing the change in electric resistance of the thermal sensitive element due to the change of temperature.

Generally, a thermistor made of the transition metal oxides in which the resistance value is changed depending on the temperature and a thin film metallic resistance material or thin film thermocouple are used for the thermal sensitive element of the infrared sensor.

Usually, since the infrared ray dosages radiated from the object to be detected are weak, the following matters are required: ① a thermal capacity for the thermal sensitive element of the sensor should be small, ② infrared radiation absorption characteristic for the thermal sensitive element of the sensor should be good, and ③ high accurate element manufacturing technology is required.

From such a standpoint, there has been developed an infrared sensor provided with the thermal sensitive element such as a thermistor of the amorphous silicon type or the like at the infrared detecting portion thereof supported by means of the micro-bridge on the cavity formed on the silicon substrate.

However, even if the infrared detector has such a construction, since the infrared rays are weak, sufficient sensitivity cannot be obtained. For the above reasons, an infrared detector which is improved in light of these drawbacks is proposed. For example, Japanese Patent Application Laid Open No. Hei 6-137935 has disclosed a thermal type infrared detector using a similar thin film resistor.

The explanations thereof are given with referring FIG. 4. The infrared detector comprises the infrared sensor of which the cavity is formed within the substrate is placed on the base 2. The infrared detector is provided with the infrared detecting portion 11 composed of the resistor layer having the pair of electrodes on the insulation thin film supported by the crossbridging construction on the substrate 10. The insulation layer 12 of reverse side of the substrate 10 is fastened to the basement 2 with adhesive bonding. The recess 6 is provided for the base 2 the position of which is opposite to the infrared detecting portion 11. Further the terminal 8 which is penetrated into the base 2 is provided. The terminal 8 is connected to the electrode 13 of the infrared sensor by means of the wire 9. The reference numeral 4 shows the cover body roofing the infrared sensor. A filter 3 is provided for the cover body.

The recess 6 is formed on the base 2 of the infrared detector so that the clearances to the infrared detecting portion 11 are of one depth of the recess 6 distant from the base 2. Since the gases intervene between the infrared detecting portion 11 and the base 2, the heat conduction between the infrared detecting portion 11 and the base 2 is lessened. It renders the thermal capacity of the infrared detecting portion 11 low value thereby in causing the thermal insulation property to make good. The sensitivity of the infrared sensor is improved over the conventional case.

In the conventional infrared detector, in the case that the thermal conductivity of the surface of base is large, heat which moves from the detector toward the base increases with heat transfer, thereby the temperature rise of the infrared sensor is decreased. For the above reasons, it causes the thermal insulation property of the infrared detecting portion to enhance by providing the recess on the base portion which is opposite to the infrared detecting portion.

However, there are drawbacks in which accurate temperature detection can not be performed in that even if the thermal insulation property enhanced by enlarging the spacing between the base and the recess, if the material for the base has high emissivity, it renders the output of the infrared detecting portion influential.

Further, there are drawbacks in which even if the accurate temperature detection is possible, substantial improvement of the detecting sensitivity can not be desired, because even if the material for the base has low emissivity, only it is not influenced by the radiant heat from the base.

SUMMARY OF THE INVENTION

In view of the foregoing, it is an object of the present invention to provide an infrared detector which can improve a detecting sensitivity and a detecting efficiency by receiving the infrared rays efficiently radiated from the object to be detected.

According to the first aspect of the present invention, for achieving the above-mentioned object, there is provided an infrared detector having an infrared detecting portion composed of a thermal sensitive resistor film on an insulating film provided for one surface of a semiconductor substrate, a cavity formed within said substrate, an infrared sensor which makes said infrared detecting portion a crossbridging construction, installed on a base, a recess formed on a portion which is opposite to said infrared detecting portion, resting on said base on which said infrared sensor is placed, and an infrared reflecting film provided for at least a bottom surface of said recess.

According to the second aspect of the present invention, there is provided an infrared detector having an infrared detecting portion composed of a thermal sensitive resistor film on an insulating film provided for one surface of a semiconductor substrate, a cavity formed within said substrate, an infrared sensor which makes said infrared detecting portion a crossbridging construction, installed on a base, a penetration formed on a portion which is opposite to said infrared detecting portion, resting on said infrared sensor of said base on which said infrared sensor is placed, and an infrared reflecting film for sealing said penetration from outside of said base.

According to the third aspect of the present invention, there is provided an infrared detector having an infrared detecting portion composed of a thermal sensitive resistor film at an insulating film provided for one surface of a semiconductor substrate, a cavity formed within said substrate, an infrared sensor which makes said infrared detecting portion a crossbridging construction, installed on a base, a curved recess formed on a portion which is opposite to said infrared detecting portion, resting on said base on which said infrared sensor is placed, and an infrared reflecting film provided for an inner surface of said curved recess.

According to the fourth aspect of the present invention, there is provided an infrared detector of the above-described second aspect wherein an infrared reflecting board which is of high infrared reflection factor made of metallic board is substituted for said infrared reflecting film.

As described hereinbefore, the infrared detector according to the present invention causes the temperature of the thermal sensitive resistor film of the infrared detecting portion to rise by injection of the infrared rays emitted from the object to be measured. The infrared rays reflected by the infrared reflecting film provided on the inner surface of the recess of the base can impose a temperature rise of the thermal sensitive resistor film. Detecting sensitivity of the infrared detector is improved since the thermal insulation between the infrared detector and the base is good caused by the fact that the space between the infrared detecting portion and the base becomes large.

Further, it causes the detecting sensitivity to be improved, since it is capable of irradiating the infrared rays toward the infrared detecting portion by virtue of causing the infrared reflecting film to be curved.

Furthermore, it causes detecting sensitivity to be improved, since the infrared reflecting board with high infrared reflecting factor is substituted for the infrared reflecting film.

The above and further objects and novel features of the invention will be more fully understood from the following detailed description when the same is read in connection with the accompanying drawings. It should be expressly understood, however, that the drawings are for purpose of illustration only and are not intended as a definition of the limits of the invention.

DETAILED DESCRIPTION OF THE PREFERRED EMBODIMENTS

A preferred embodiment of the infrared detector according to the present invention will now be described in detail referring to the accompanying drawings.

Figure 1A:
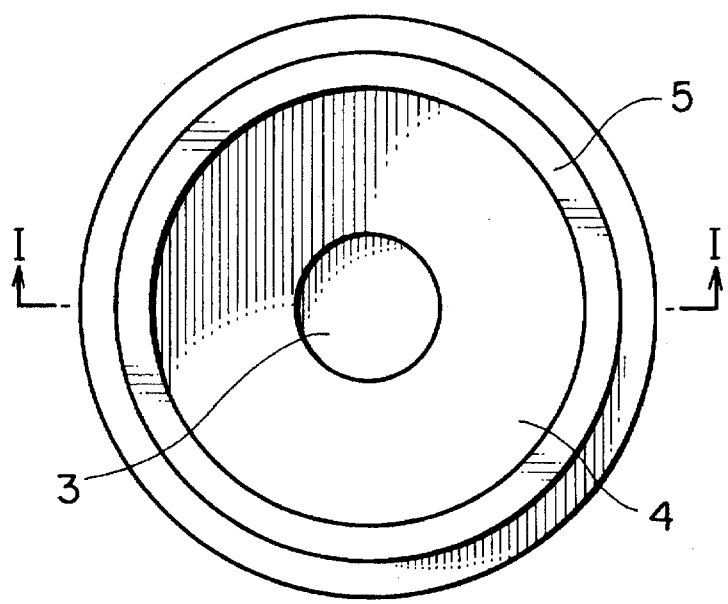
FIG. 1A is a plan view showing an embodiment of an infrared detector according to the present invention.
Figure 1B:
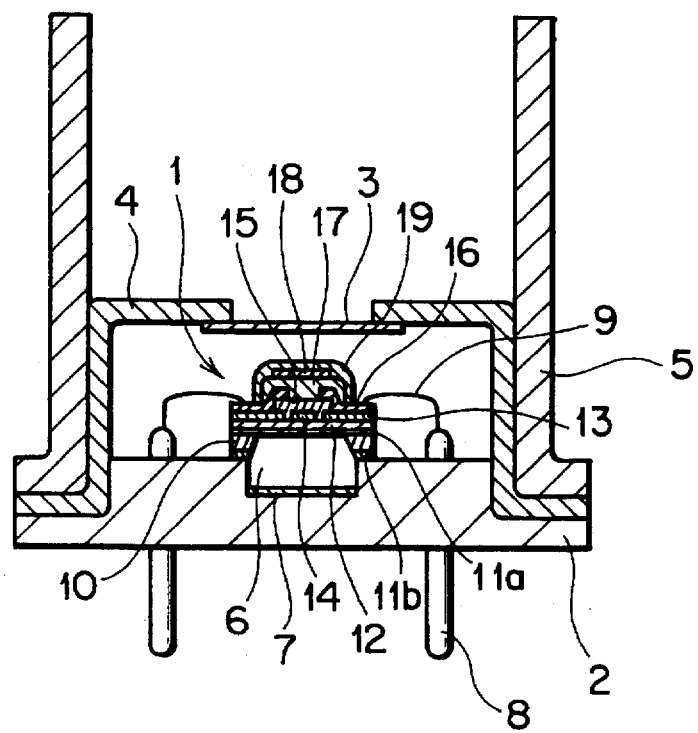
FIG. 1B is a sectional view of the infrared detector of FIG. 1A, taken along line I—I thereof.

FIG. 1A is a plan view showing an embodiment of an infrared detector according to the present invention, and FIG. 1B is a sectional view of the infrared detector of FIG. 1A, taken along line I—I thereof.

In FIGS. 1A and 1B, reference numeral 1 designates an infrared sensor placed on a base 2. In the infrared sensor 1, an electrode portion thereof is connected to a terminal 8 by means of a wire 9. The infrared sensor 1 placed on the base 2 is sealed by a cover body 4 provided with a filter 3. A collimator 5 is provided around the cover body 4.

A substrate 10 for the infrared sensor 1 is fastened on the base 2 which is made of metal or synthetic resin or the like by means of adhesives such as for example low-melting glass, eutectic alloy (Au—Si), solder or the like. The terminal 8 and the electrode of the infrared sensor by which the base 2 is penetrated are bonded by the wire 9. It is also good to wire by using lead frame and so forth. In the base 2 on which the infrared sensor is placed, the recess 6 is formed thereon opposite to the infrared detecting portion of the infrared sensor 1.

On an inside surface of the recess 6, in particular, there is provided an infrared reflecting film 7 for the base. A material in which emissivity is small and reflection factor is large is used. For example, gold or aluminum is good to use. An open area of the recess 6 is at least larger than that of the infrared detecting portion of the infrared sensor 1.

The infrared sensor 1 is composed of insulating films 11a, 11b made of silicon nitride or silicon oxide formed at obverse surface and reverse surface of the silicon substrate 10, a insulating film 12 made of aluminum oxide or tantalum oxide which is provided on the insulating film 11a, a pair of metal base layers 13 made of tantalum (Ta), titanium (Ti), chromium (Cr), molybdenum (Mo) and the like which are provided for the insulating film 12, an insulating film 14 made of silicon oxide provided between the pair of metal base layers 13, at least one layer of thermal sensitive resistor film 15 formed on the insulating film 14, a pair of electrode layer 16 made of platinum (Pt) which come into contact with the thermal sensitive resistor film 15 formed oppositely to each other, a protective insulating film 17 provided on the thermal sensitive resistor film 15, and a buffer film 18 made of tantalum oxide or titanium oxide intervening between the protective insulating film 17 thereunder and a glass layer 19 made of borosilicate glass thereon. The cavity is formed within the substrate corresponding to the infrared detecting portion by the technique of etching. The infrared detecting portion is constituted as the crossbridging construction.

The base 2 on which the infrared sensor 1 is placed fixedly is sealed by covering with the cover body 4 made of metal or the like. When necessary an internal space thereof is sealed, with inert-gas filled or under reduced pressure. An aperture is provided for an upper surface of the cover body 4, an optical filter 3 is attached thereto. Single crystal silicon, glass, transparent synthetic resin or the like each of which has high transmittancy for the infrared rays to be detected is used.

A collimator 5 made of aluminum the properties of which are large thermal conductivity, small infrared emissivity, and high infrared reflection factor is installed around the cover body 4. The shape of the collimator 5 is selected as they see fit depending on size and temperature of the object to be measured or distance thereof. It is capable of detecting accurately the infrared rays of the object to be detected aim at detection by virtue of providing the collimator 5.

In the infrared detector of the above described embodiment, the temperature at that time is measured in such a way that it causes the infrared rays with constant energy irradiated from the black body furnace to irradiate through the filter surface toward the thermal sensitive resistor film. As a result thereof, the value is 0.9 m°C./µW under the exception of the infrared reflecting film, and the value is 1.2 m°C./µW under forming the infrared reflecting film 7 as the embodiment. Namely, It has been proved that high output sensitivity can be obtained in that the infrared energy is effectively transformed to heat energy at the infrared detecting portion.

Of course, this improvement of detecting efficiency does not depend on the infrared sensor but effect by virtue of the infrared reflecting film 7, accordingly it is obvious to obtain the same effect even if conventional infrared sensor of crossbridging construction is used.

Figure 2A:
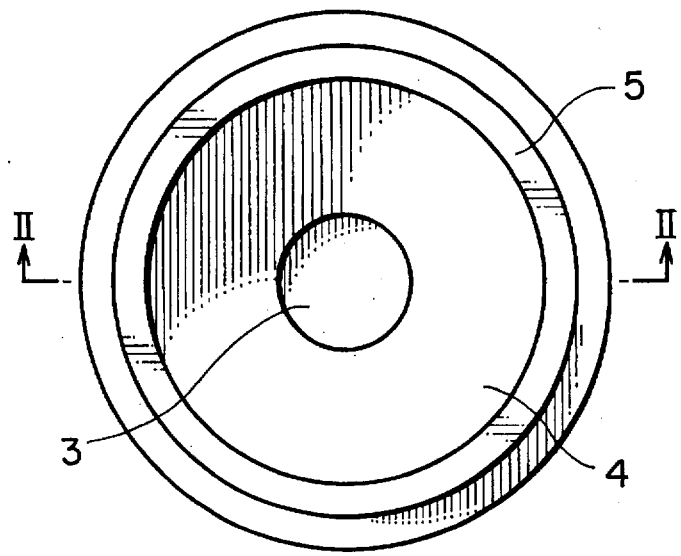
FIG. 2A is a plan view showing an another embodiment of an infrared detector according to the present invention.

Next, it will be described the another embodiment of the infrared detector according to the invention referring to FIGS. 2A, 2B and 2C. FIG. 2A is the plan view showing the another embodiment of the infrared detector according to the present invention, FIG. 2B is the sectional view of the infrared detector of FIG. 2A, taken along line II—II thereof.

Figure 2B:
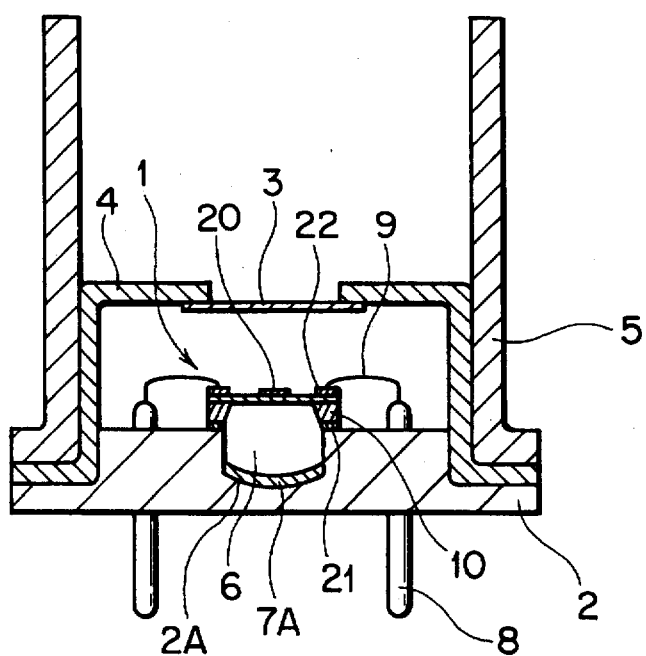
FIG. 2B is a sectional view of the infrared detector of FIG. 2A, taken along line II—II thereof.
Figure 2C:
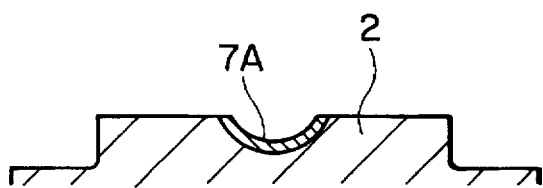
FIG. 2C is a sectional view showing a basement of the another embodiment of FIG. 2A.

In FIGS. 2A, 2B and 2C, the infrared detecting portion of the infrared sensor 1 has the crossbridging construction which is different from the infrared sensor according to FIG. 1. The same infrared sensor as FIG. 1 can be permitted. The recess 6 is formed on the base 2, a curved surface 2A is formed on the bottom thereof, and the infrared reflecting film 7A is provided for the inner surface of the curved surface 2A.

Thus, by making the infrared reflecting film 7A curved, since the infrared rays reflected at the infrared reflecting film 7A are converged on the infrared detecting portion 20, higher output sensitivity can be obtained.

In the infrared sensor 1, an insulating film 21 is formed on the reverse side of the substrate 10, the electrode 22 of the infrared sensor 1 is connected to the terminal 8 by means of the wire 9.

A shape of curved surface for the infrared reflecting film 7A and establishment of a distance between the infrared detecting portion 20 and the curved surface can be decided depending on an effective area of the infrared detecting portion and conditions of the incident infrared ray.

Further in FIG. 2C, a curved recess 2A is formed on the base 2 of the infrared detector, on the inside surface thereof the infrared reflecting film 7A is provided. Thus such configurations yield the same effect as the above described ones.

Figure 3A:
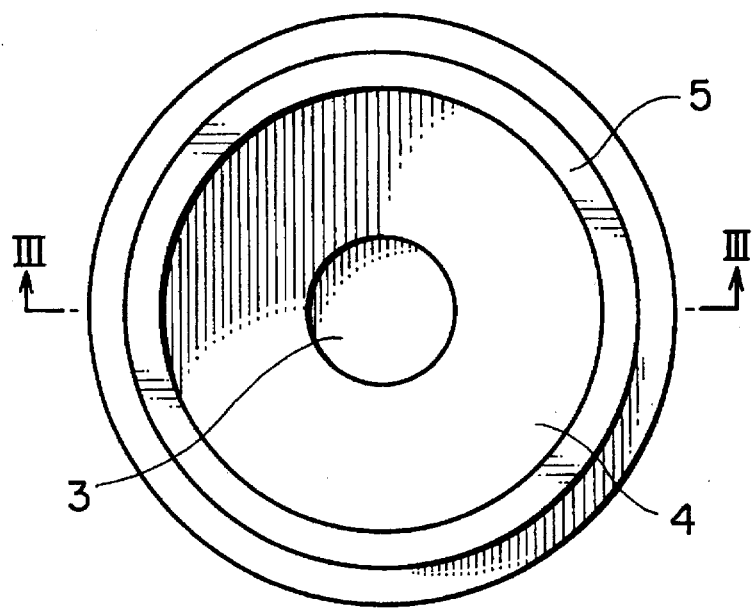
FIG. 3A is a plan view showing an another embodiment of an infrared detector according to the present invention.

Next, it will be described the another embodiment of the infrared detector according to the invention referring to FIGS. 3A, 3B. FIG. 3A is the plan view showing the another embodiment of the infrared detector according to the present invention, FIG. 3B is the sectional view of the infrared detector of FIG. 3A, taken along line III—III thereof.

Figure 3B:
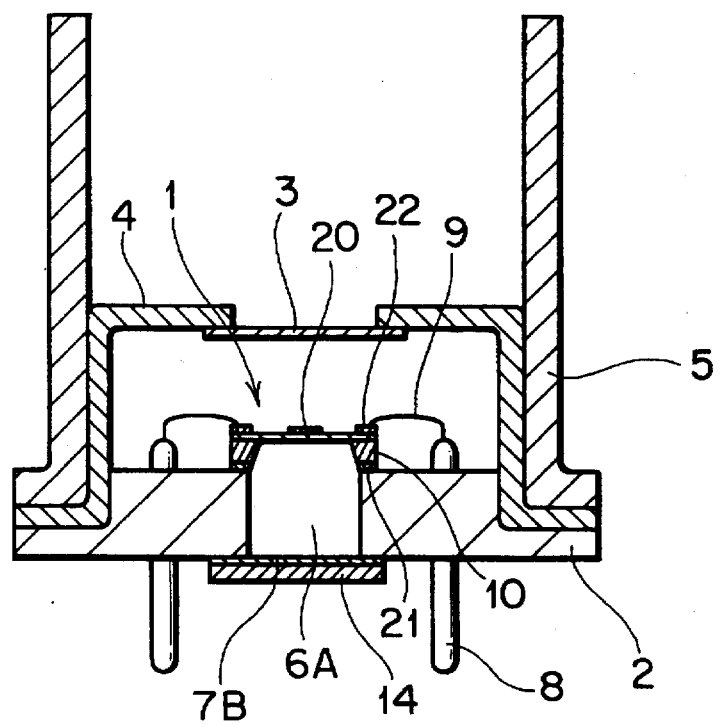
FIG. 3B is a sectional view of the infrared detector of FIG. 3A, taken along line III—III thereof.
Figure 4:
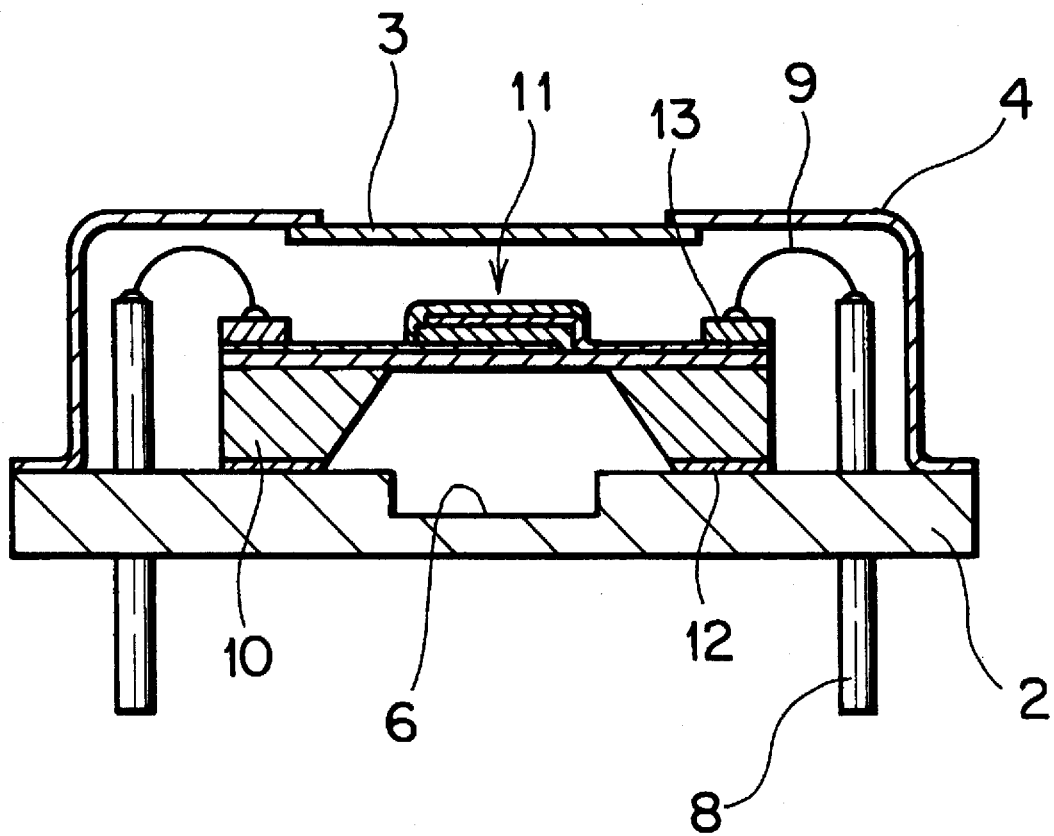
FIG. 4 is a sectional view showing a conventional infrared detector.

In FIGS. 3A and 3B, a penetrated portion 6A is provided for the base 2 instead of providing the recess, it causes a substrate 14 on which the infrared reflecting film 7B is formed to insert into the penetrated portion 6A from the basement 2, with the penetrated portion 6A sealed. As described above, gold or aluminum thin film is used for the infrared reflecting film 7B, it does not necessarily use the infrared reflecting film, it is good for use a board like configuration as an aluminum board.

Further, the infrared sensor 1 is effective if it has simply the crossbridging construction, it is not necessarily to be the infrared sensor as shown in the embodiment of FIG. 1.

As described above, in the infrared detector according to the present invention, since the recess or the curved recess is formed at the base directly under the infrared detecting portion, the infrared reflecting film with high infrared reflecting factor is formed thereon, the infrared rays which transmits the infrared detecting portion of the infrared sensor is reflected at the infrared reflecting film and the infrared rays irradiate the infrared detecting portion twice. There are advantages that the detecting efficiency rises and it is capable of improving the output sensitivity.

Further, regardless of the shape of the base in particular, the thickness thereof, it has similar effect of the infrared detector of which the reflecting film is formed on the bottom surface of the base, since it is capable of determining distance between the infrared detecting portion and the base by providing the penetration for the base.

Further, there is advantage that it is capable of further rising the detecting sensitivity by converging the incident infrared rays at the infrared reflecting surface with curved surface, and by virtue of causing the infrared detecting portion to transmit by forming the curved surface at the reflecting surface.

While preferred embodiments of the invention have been described using specific term, such description is for illustrative purpose only, and it is to be understood that changes and variations may be made without departing from the spirit or scope of the following claims.

What is claimed is:

1. An infrared detector comprising:

an infrared sensor having an infrared detecting portion composed of a thermal sensitive resistor film on an insulating film provided on a surface of a semiconductor substrate;

a cavity of said substrate;

the infrared sensor, which makes said infrared detecting portion crossbridging in construction over said cavity, installed on a base;

a penetration formed on a portion of said base facing to said infrared detecting portion, on which base said infrared sensor is placed; and an infrared reflecting film for sealing said penetration from outside of said base.

2. An infrared detector comprising:

an infrared sensor having an infrared detecting portion composed of a thermal sensitive resistor film on an insulating film provided on a surface of a semiconductor substrate;

a cavity of said substrate;

the infrared sensor, which makes said infrared detecting portion crossbridging in construction over said cavity, installed on a base;

a penetration formed on a portion of said base facing to said infrared detecting portion, on which base said infrared sensor is placed; and an infrared reflecting board of a high infrared reflection factor made of a metallic board for sealing said penetration from outside of said base.

* * * * *